United States Patent
Fukushima

(10) Patent No.: US 6,925,289 B2
(45) Date of Patent: Aug. 2, 2005

(54) BROADCAST RECEIVER AND CHANNEL SCANNING METHOD

(75) Inventor: Takahiro Fukushima, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 499 days.

(21) Appl. No.: 10/224,301

(22) Filed: Aug. 20, 2002

(65) Prior Publication Data

US 2003/0050024 A1 Mar. 13, 2003

(30) Foreign Application Priority Data

Sep. 13, 2001 (JP) ........................................ 2001-277984

(51) Int. Cl.[7] .............................................. H04B 1/18
(52) U.S. Cl. ................... 455/161.2; 455/179.1; 455/184.1; 455/185.1; 455/186.1; 455/190.1; 455/191.1
(58) Field of Search ........................... 455/161.2, 179.1, 455/184.1, 185.1, 186.1, 512, 566, 187.1, 188.1, 132–138, 279.1, 277.1, 150.1, 276.1, 139, 134, 272–273, 151.1, 166.2, 95, 88; 370/468, 326, 527; 342/100; 381/77, 86

(56) References Cited

U.S. PATENT DOCUMENTS

| 5,119,507 A | | 6/1992 | Mankovitz |
| 5,719,637 A | | 2/1998 | Ohkura et al. |
| 6,163,683 A | * | 12/2000 | Dunn et al. .............. 455/151.1 |
| 6,236,844 B1 | * | 5/2001 | Cvetkovic et al. .......... 455/273 |
| 6,600,908 B1 | * | 7/2003 | Chan ....................... 455/150.1 |
| 2002/0176372 A1 | * | 11/2002 | Ichikawa et al. ........... 370/254 |
| 2004/0110522 A1 | * | 6/2004 | Howard et al. ............. 455/512 |

* cited by examiner

Primary Examiner—Pablo N. Tran
(74) Attorney, Agent, or Firm—Brinks Hofer Gilson & Lione

(57) ABSTRACT

A channel scanning method in a multi-channel digital broadcast is provided for enabling a user to identify the broadcast contents of a channel being currently received with accuracy during the channel scan, even though the broadcast contents may change within a channel scanning time period. In one embodiment of the channel scanning method, a receive channel is switched at predetermined intervals (the scanning time period), it is checked whether the broadcast contents of the channel being received currently, after the channel switching, will change within the scanning time period, and a time period for receiving the channel is prolonged, if the broadcast contents will change.

14 Claims, 8 Drawing Sheets

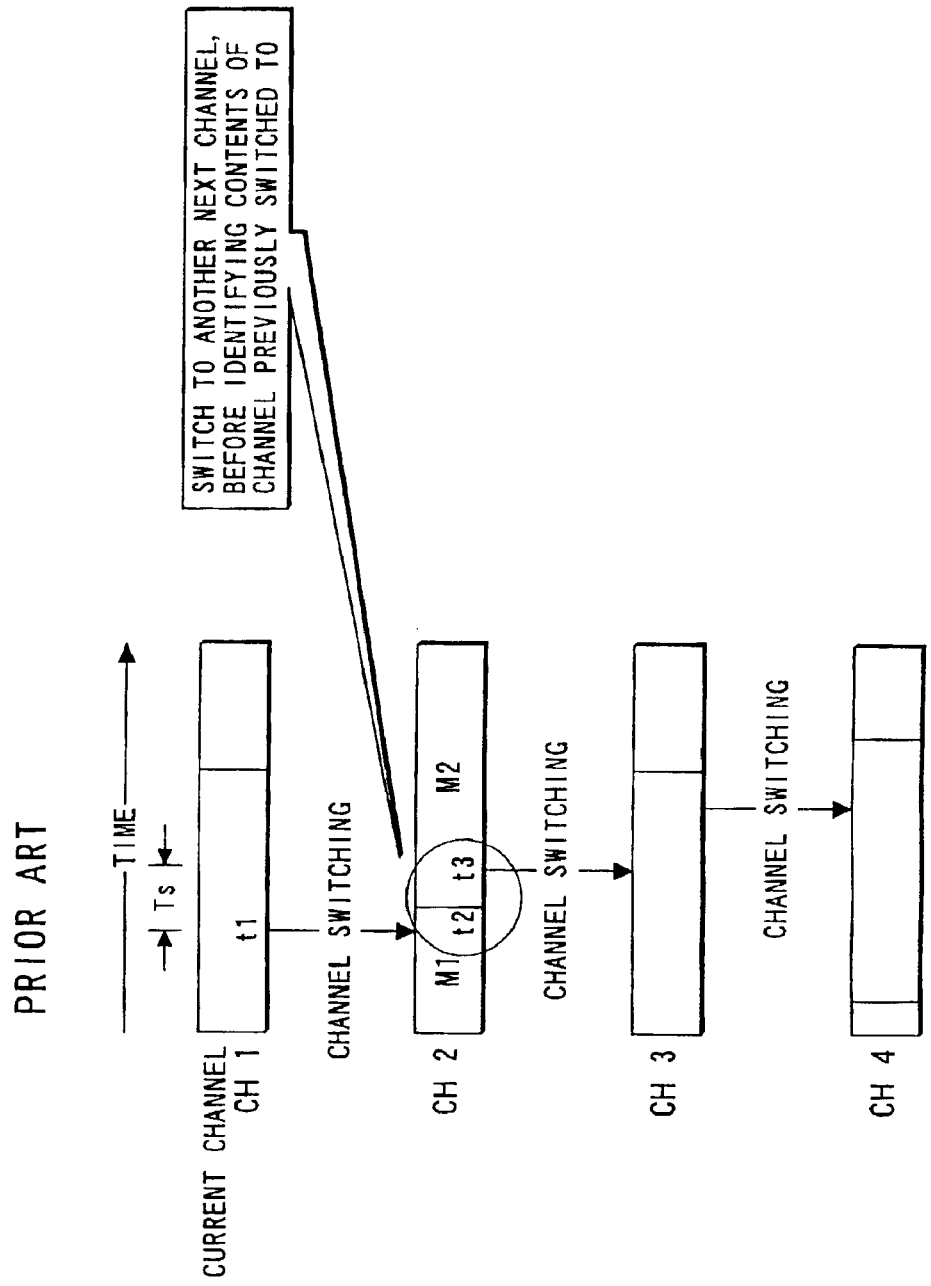

BROADCAST RECEIVER AND CHANNEL SCANNING METHOD

BACKGROUND OF THE INVENTION

1. Field of the Invention

The present invention relates to a broadcast receiver and a channel scanning method, and more particularly to a multi-channel broadcast receiver for switching a receive channel at predetermined intervals and a channel scanning method using same.

2. Description of the Related Art

In recent years, digital broadcasts have come into service that convert broadcast signals into digital signals and compress the digital signals to transmit them. Such digital broadcasts have less degradation in sound and image compared with conventional television and radio broadcasts. The compression of data as described also enables a digital broadcast to provide multi-channel broadcasts which handle more than one hundred channels. FIG. 7 is a diagram illustrating the construction of a frame in a digital broadcast. This figure shows that broadcast contents including "n" channels are subjected to mapping (in other words, time-division multiplex) in a frame of a predetermined length. In a digital broadcast, contents of this frame are transmitted in sequence, thereby broadcasting "n" channels simultaneously.

As described above, digital broadcasts allow a user to select a desired program from much more programs (channels) than the conventional broadcast media. In such multi-channel digital broadcasts, a scanning function of automatically switching a receive channel at predetermined intervals is of great value as a method of searching for and selecting a desired channel from multiple channels by the user's simple and easy operation of keys.

In a conventional receiver having this scanning function, when a channel scan is instructed by a keystroke of a scan key, the receive channel is automatically switched to another channel at given intervals (hereinafter referred to as a scanning time period) such as 5 seconds or 7 seconds. When a desired channel is found, the broadcast contents of the desired channel are continuously received by re-pressing the scan key. In such cases, if the user sets channels belonging to a desired genre on a setting screen in advance, the channel scan will be carried out within the range of the set channels.

With channel scanning in a conventional receiver, there is a case where the broadcast contents of a channel being currently received, after the channel switching, change during the scanning time period. For example, one piece of music ends and another piece of music begins on one channel within the scanning time period. When this kind of changeover of the broadcast contents occurs, the user cannot accurately identify the broadcast contents or the music provided by the channel being currently received. Then, before the user can identify the broadcast contents, the receive channel is switched to the next channel, thus leading to a disadvantage that the user may miss a program that he or she really wishes to receive (view and/or hear). FIG. 8 explains this kind of case. Referring to this figure, a channel CH1 which was received before a time $t_1$, is switched to a next channel CH2 at the time $t_1$. The channel CH2 changes its broadcast contents M1 to other contents M2 at a time $t_2$ within a scanning time period Ts after the time $t_1$. Then the channel CH2 is also switched to a next channel CH3 at a time $t_3$. Thus, in a case where the broadcast contents change during the scanning time period, it is difficult to identify the broadcast contents of the channel being currently received, resulting in a disadvantage that the receive channel is switched to a next channel before identifying the current broadcast contents thereof.

SUMMARY OF THE INVENTION

The present invention has been accomplished in view of the above-mentioned technical background, and it is an object of the present invention to realize an improvement which enables a user to identify broadcast contents of a channel being currently received with accuracy, even though the broadcast contents may change during a scanning time period.

It is another object of the present invention to realize an improvement which controls a receive channel such that the broadcast contents of the receive channel do not change within a scanning time period, thereby enabling a user to identify the broadcast contents with certainty.

To solve the foregoing problems, according to a first aspect of the present invention, there is provided a channel scanning method in a multi-channel broadcast for switching a receive channel at predetermined time intervals, comprising: checking whether or not the broadcast contents of a receive channel being currently received, after the channel switching, change within the predetermined time interval; and prolonging a time period for receiving the channel, which is being received, in a case where the broadcast contents change. Thus, even if the broadcast contents change, the scanning time period is prolonged, thereby allowing the user to identify the current broadcast contents with accuracy.

According to a second aspect of the present invention, there is provided a channel scanning method in a multi-channel broadcast for switching a receive channel at predetermined time intervals, comprising: extracting information which is transferred together with the broadcast contents of a next channel to be received and which specifies a time of a changeover of the broadcast contents; checking whether or not the broadcast contents of the next channel change within the predetermined time interval in the case of switching to the next channel, with reference to the extracted information; and receiving the next channel if the broadcast contents do not change, while repeatedly performing the above extracting and checking for a further next channel to be received if the broadcast contents do change. Thus, the broadcast contents do not change within the scanning time period, thereby enabling the user to identify the broadcast contents with certainty.

BRIEF DESCRIPTION OF THE DRAWINGS

FIG. 8 is an explanatory diagram showing the case where the broadcast contents change during a scanning time period, in a conventional broadcast receiver.

DESCRIPTION OF THE PREFERRED EMBODIMENTS

Hereinafter some preferred embodiments of the present invention will be described in detail with reference to the accompanying drawings.

(A) Construction of Digital Broadcast Receiver

Figure 1:
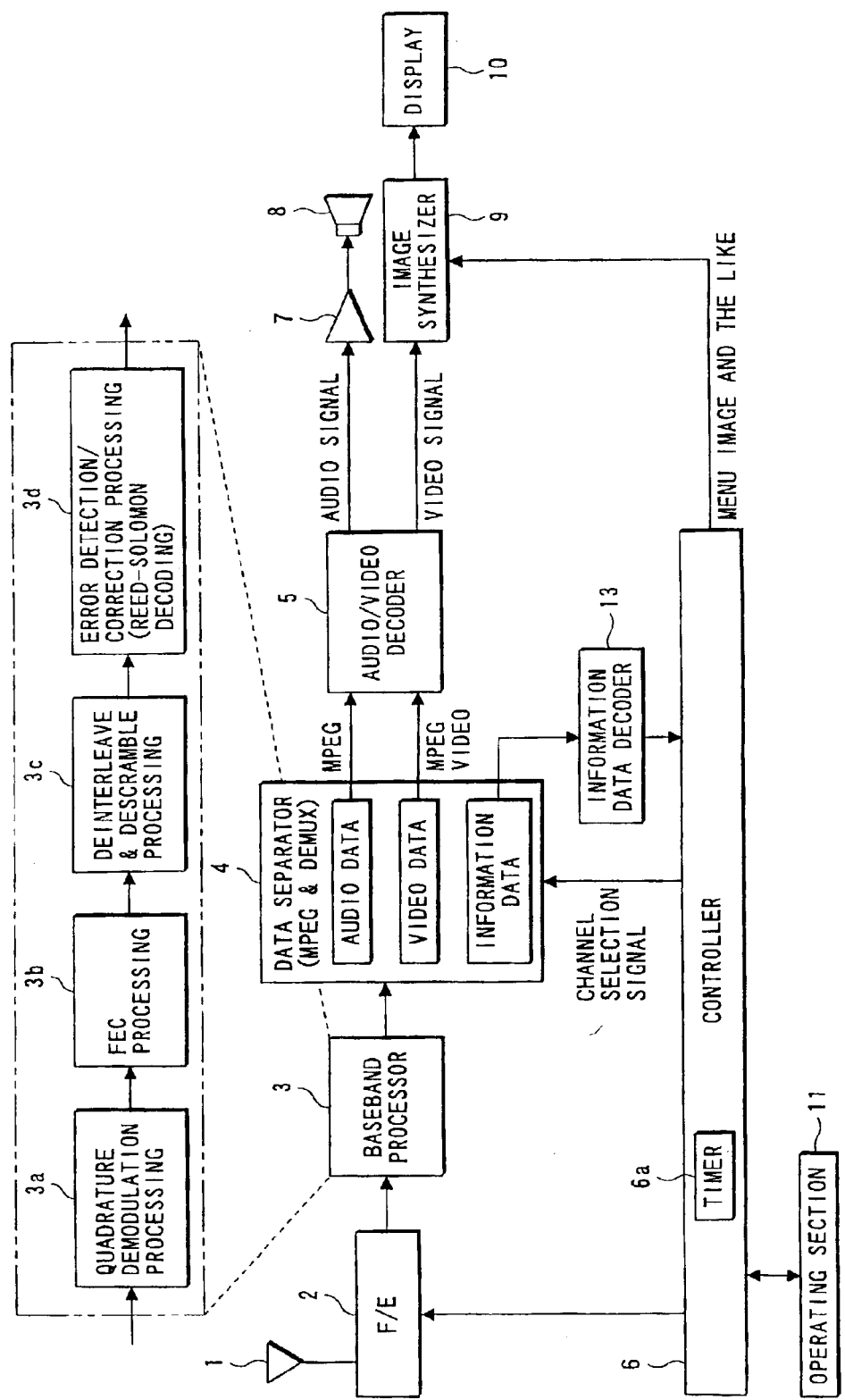
FIG. 1 is a diagram showing the construction of a digital broadcast receiver according to the present invention.

FIG. 1 is a diagram showing the construction of a digital broadcast receiver according to the present invention. An antenna 1 receives broadcast signal radio waves from a satellite. A front end (F/E) section 2 extracts a broadcast signal with a desired receive frequency component from the broadcast signals received via the antenna 1, and frequency-converts the extracted broadcast signal to provide an intermediate frequency signal. A baseband processor 3 comprises a quadrature demodulator 3a, a forward error correction (FEC) processor 3b, a de-interleave & descramble processor 3c, and an error detection/correction processor 3d. The baseband processor 3 subjects the intermediate frequency signal provided from the front end section 2 to the quadrature demodulation processing and the FEC (Forward Error Correction) processing. Subsequently, the baseband processor 3 releases the de-interleave processing, while descrambling the intermediate frequency signal to restore it to a previous data string. Finally, the baseband processor 3 performs the error detection/correction processing (Reed-Solomon decoding processing) to provide high-efficiency code data (MPEG data). A data separator 4 separates each of MPEG video data/MPEG audio data and information data of the channel, which has been selected by a user or which has been specified by a scanning function, from the high-efficiency code data (MPEG data) of the entire channel provided from the baseband processor 3. Thereafter, the data separator 4 provides the MPEG video data/MPEG audio data to an audio/video decoder 5, and the information data to a controller 6 via an information data decoder 13. The audio/video decoder 5 decodes the MPEG video data/MPEG audio data into an audio signal and a video signal, respectively, to supply the audio signal to an amplifier 7 and the video signal to an image synthesizer 9. Consequently, the audio is provided from a speaker 8, while the video is displayed on a display 10.

The controller 6 is used to control the overall digital broadcast receiver, and performs a frequency tuning control of the front end section 2, an instruction control of the receive channel to the data separator 4, and a channel scanning control. Simultaneously, the controller 6 creates a menu image for the channel selection on the basis of information about the arrangement of programs received, or creates an image of searched results, to supply the image to the image synthesizer 9. The image synthesizer 9 synthesizes the video signal(s) from the audio/video decoder 5 and the image from the controller 6 to display the synthesized image on the display 10. An operating section 11 is operable to perform a selecting operation of a channel to be viewed, a designating operation of a genre of interest upon a search for the genre, an adjusting operation of volume, an instructing operation of the channel scan, and the like.

Figure 2:
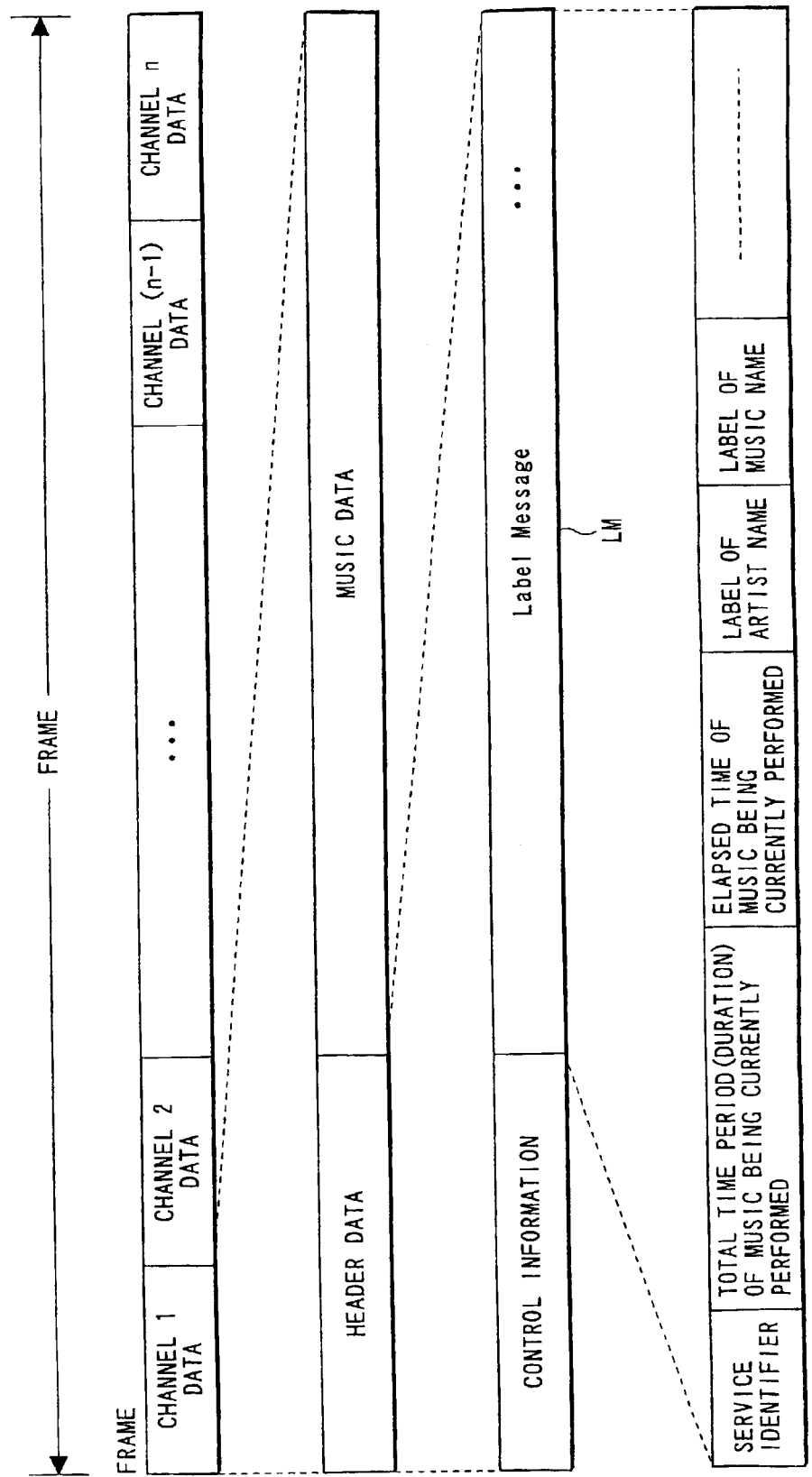
FIG. 2 is an explanatory diagram showing the construction of a frame in a digital broadcast.

FIG. 2 is an explanatory diagram showing the construction of a frame in the digital broadcast. This digital broadcasting system performs a time division multiplex processing of the broadcast contents including "n" channels into the frame of a predetermined length, and transmits this time division multiplex frame in sequence, thereby simultaneously broadcasting all n channels. This frame includes data on all channels, namely, channel 1 through channel n. Each channel's data includes 1) header data; 2) data on the broadcast contents currently being broadcast (for example, music data if music is being broadcast). The header data includes (1) control information; (2) a label message LM, and the like. The label message LM includes a service identifier, a total time period (duration) of the music currently being performed, an elapsed time of the music currently being performed, the name of the artist, the name or title of the music, and so on.

(B) Channel Scan Control of First Preferred Embodiment

Figure 3:
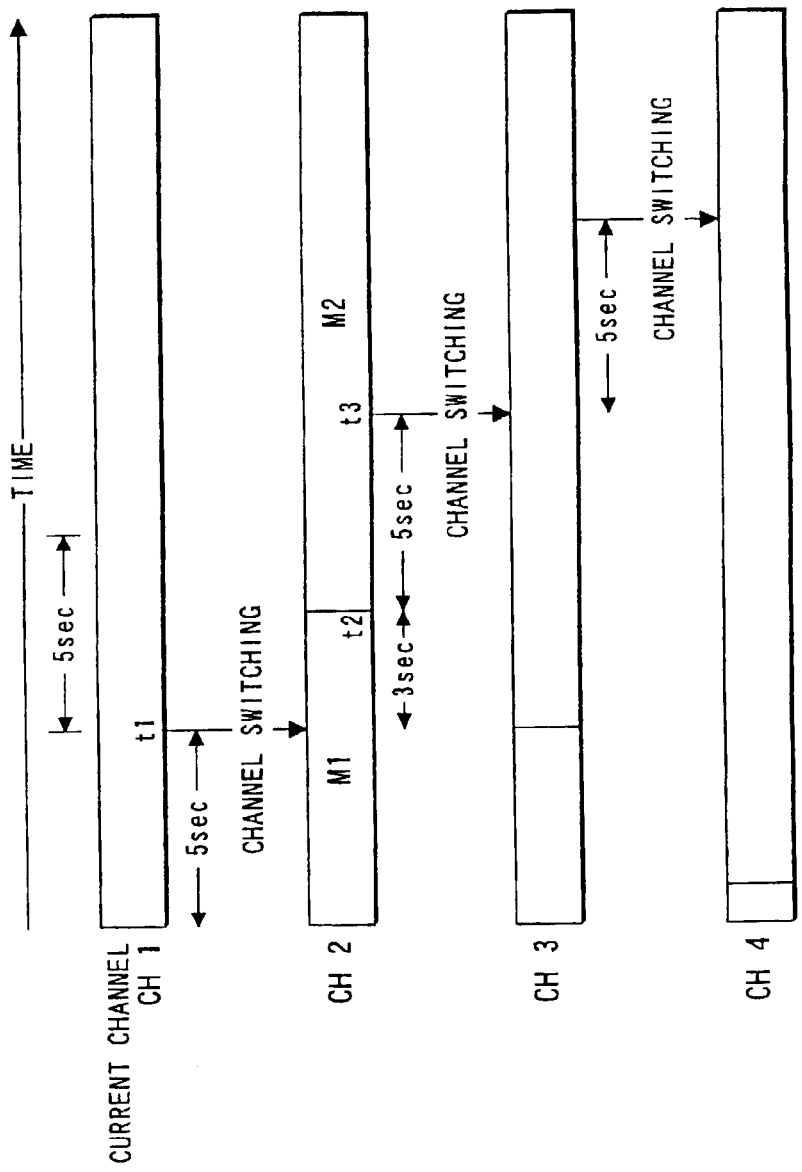
FIG. 3 is an explanatory diagram showing the channel scan control according to a first preferred embodiment of the present invention.

FIG. 3 is an explanatory diagram showing channel scan control according to a first preferred embodiment of the present invention.

Referring now to FIG. 3, upon receiving a channel CH1 by the scan control and after the time interval set for switching between the channels, namely, the scanning time period Ts (for example, =5 seconds) has ended, the channel CH1 is switched to a next channel CH2 at a time $t_1$. Then, upon receiving the channel CH2, if the broadcast contents M1 of the CH2 are changed into other broadcast contents M2 at a time $t_2$ within the scanning time period Ts (=5 seconds) after the time $t_1$, a receiving time period for receiving the channel CH2 is to be prolonged. Specifically, an elapsed time begins to be counted after the channel switching, and when the broadcast contents of the channel change before the scanning time period Ts (=5 seconds) has ended, the elapsed time is reset and the counting of the elapsed time is restarted from zero, so that the receiving time period is extended. Consequently, as shown in the example of FIG. 3, the channel CH2 is to be received during a further scanning time period Ts after the time $t_2$ (=5 seconds) when the broadcast contents M1 change into M2. Then at a time $t_3$, the channel CH2 is switched to a next channel CH3, and the channel CH3 is received. Accordingly, the total duration of receiving the channel (CH2) is 8 seconds. That is, even though the broadcast contents change during the scanning time period, the total scanning time period is prolonged, thereby allowing the user to identify the broadcast contents with accuracy.

Figure 4:
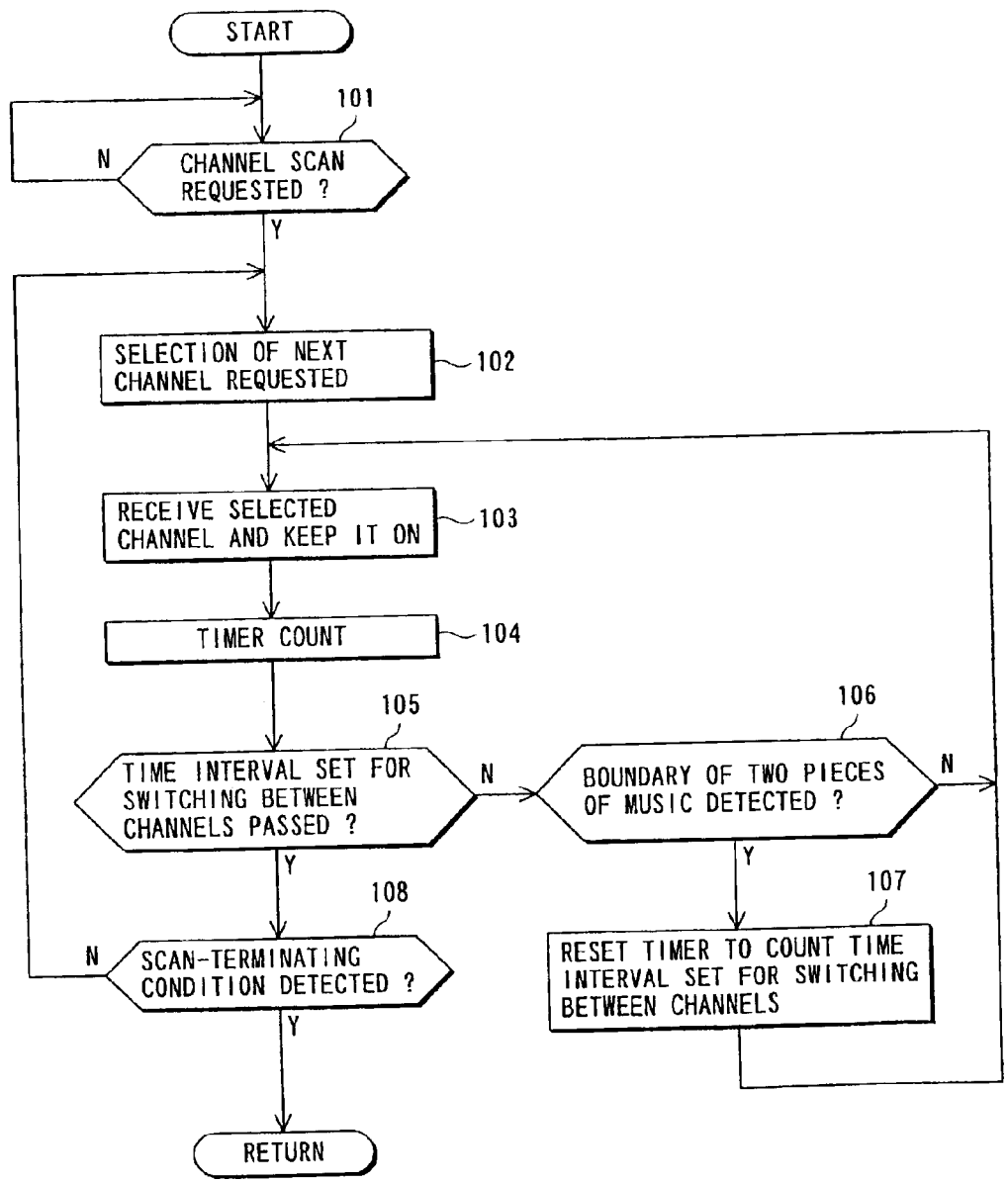
FIG. 4 is a flowchart of the operation of the digital broadcast receiver according to the first preferred embodiment.

FIG. 4 is a flow chart of the operation of the digital broadcast receiver according to the first preferred embodiment.

The controller 6 checks whether or not a channel scan has been requested by the operation of a scan key (not shown) of the operating section 11 (step 101). If requested, a receive channel is determined, and a request for the selection of the determined channel is passed to the data separator 4 (step 102). Accordingly, the data separator 4 extracts the MPEG audio data and the MPEG video data from the requested channel to provide the extracted data to the audio/video decoder 5, while providing the information data of the requested channel to the controller 6 via the information data decoder 13 (step 103). The controller 6 starts the timer 6a, so that the timer 6a counts an elapsed time after the channel switching (step 104).

Subsequently, the controller 6 checks whether the scanning time period (the time interval set for switching between the channels) Ts has ended or not (step 105). If not, that is, if the scanning time period has not ended, it is checked whether a change of the broadcast contents (for example, in a music program, a boundary between two pieces of music) is detected or not (step 106). If a change in broadcast contents is not detected, the operation returns to step 103, where the channel being currently received is to be continuously received, and proceeds to step 104 and the steps thereafter.

The change in broadcast contents is detected on the basis of checking, for example in the music program, whether the music name or title or the artist name included in the label message LB has changed or not, or on the basis of checking whether the elapsed time of the music being currently performed has reached the total length of the music.

On the other hand, if a change in broadcast contents is detected, the counting time of the timer 6a is reset (step 107). The operation then returns to the step 103, where the channel being currently received is to be continuously received, and proceeds to the step 104 and the steps thereafter. This reset of the counting time prolongs the receiving time period.

The operation described above is repeatedly performed, and if the counting time of the timer 6a exceeds the scanning time period Ts in step 105, it is checked whether a scan-terminating condition is detected or not (step 108). If the scan-terminating condition is not detected yet, the operation returns to step 102 again, and the controller 6 requests the reception of a next channel to carry out the procedures beginning with step 103.

In contrast, when the scan-terminating condition is detected in step 108, for instance, the scan key is pressed so as to set a channel for receiving (viewing and/or listening), the controller 6 terminates the channel scanning operation.

(C) Channel Scan Control of Second Preferred Embodiment

Figure 5:
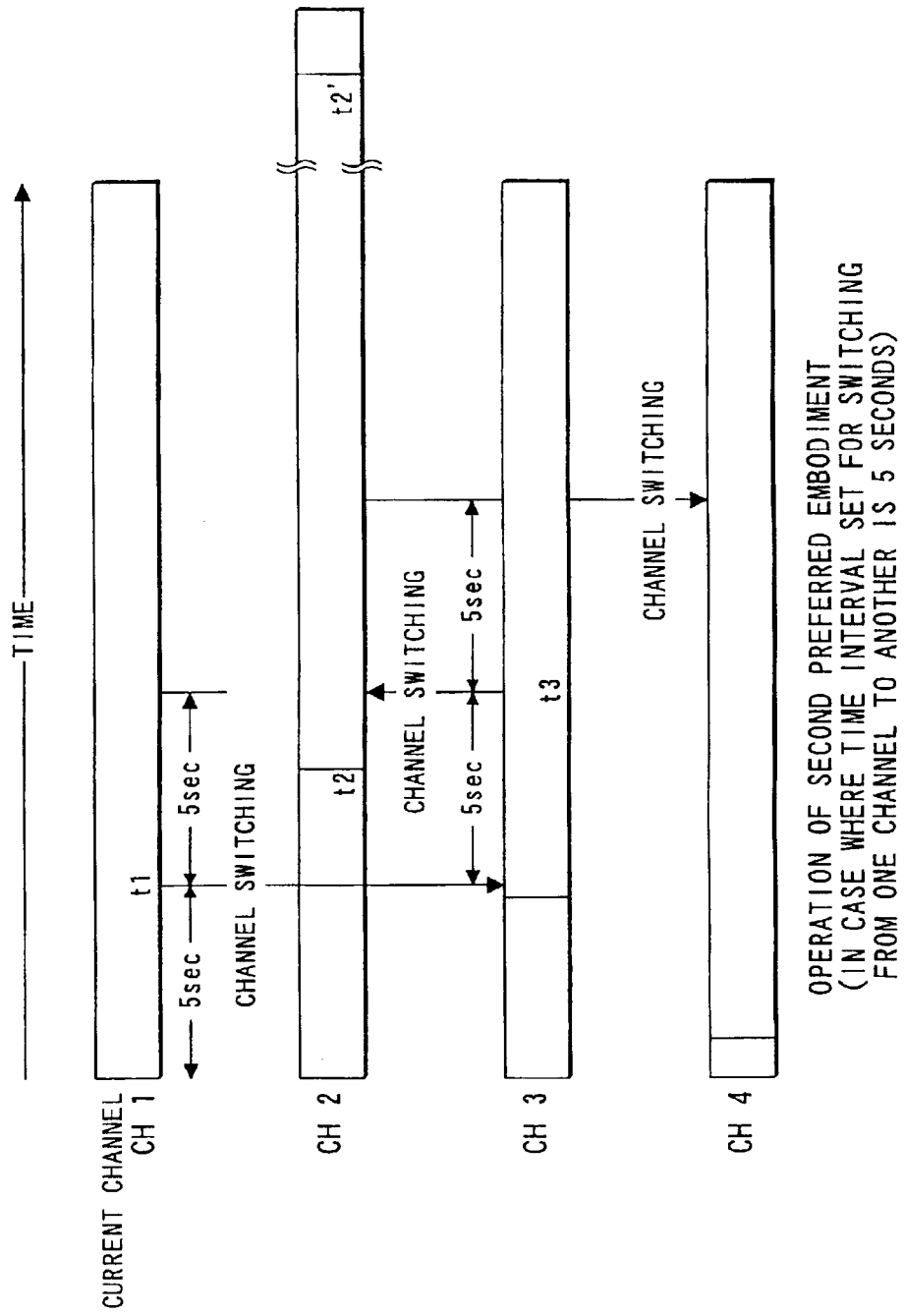
FIG. 5 is an explanatory diagram showing the channel scan control according to a second preferred embodiment of the present invention.

FIG. 5 is an explanatory diagram showing channel scan control according to a second preferred embodiment of the present invention.

Referring now to FIG. 5, upon receiving a channel CH1 by the scan control, at a time $t_1$ after the scanning time period Ts (for example, =5 seconds) has ended, information for specifying a changeover time $t_2$ of the broadcast contents of a next channel CH2 to be received is extracted from the broadcast signal. It is checked whether the broadcast contents of the channel CH2 will change within the scanning time period Ts (=5 seconds) in the case of switching to the channel CH2. FIG. 5 shows the example where the broadcast contents of the channel CH2 change at a time $t_2$ within the scanning time period Ts after the time $t_1$. In this case, the above operation will be performed again as to a further channel CH3 to be received. Thereafter, from the above operation, it turns out that in a case where the channel CH1 is directly switched to the channel CH3, the broadcast contents of the channel CH3 do not change before the scanning time period Ts (=5 seconds) has ended after the time $t_1$. Accordingly, the channel CH3 is to be received after the channel CH1.

Upon receiving the channel CH3, at a time $t_3$ after the scanning time period Ts (=5 seconds) has ended, information for specifying a changeover time $t_2'$ of the broadcast contents of the next channel CH2 to be received is extracted from the broadcast signal. It is checked whether the broadcast contents of the channel CH2 will change within the scanning time period Ts (=5 seconds) after the time $t_3$, in the case of switching to the channel CH2. The example of FIG. 5 shows that the broadcast contents of the channel CH2 do not change within the scanning time period Ts, namely 5 seconds, after the time $t_3$. Accordingly, the channel CH2 is to be received after the channel CH3. Similarly, a channel CH4 is to be received after the channel CH2, in this example.

In accordance with the operation described above, the broadcast contents of the channel being currently received never changes within the scanning time period, thereby allowing the user to identify the broadcast contents with certainty.

Figure 6:
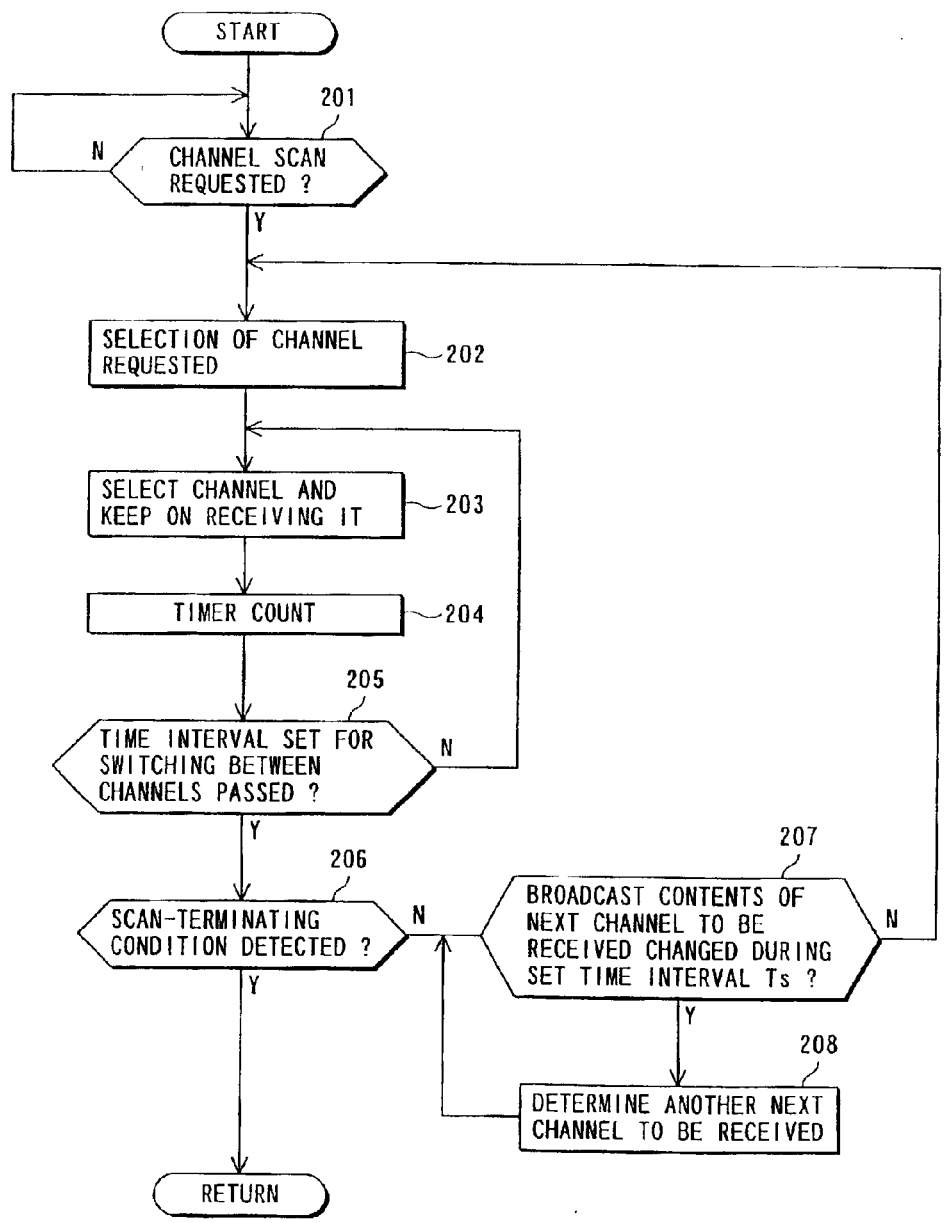
FIG. 6 is a flowchart of the operation of the digital broadcast receiver according to the second preferred embodiment.
Figure 7:
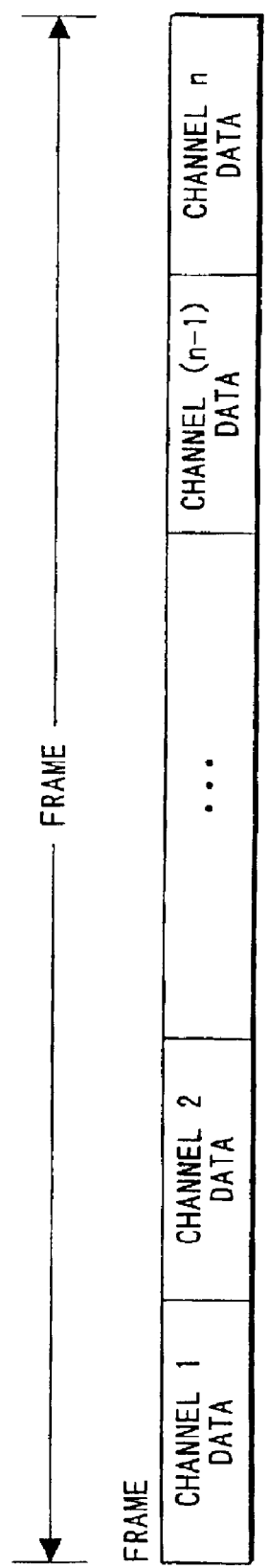
FIG. 7 is a schematic diagram of a frame in a digital broadcast.

FIG. 6 is a flow chart of the operation of the digital broadcast receiver according to the second preferred embodiment.

The controller 6 checks whether or not a channel scan has been requested by the operation of a scan key (not shown) of the operating section 11 (step 201). If requested, a channel to be received is determined, and a request for the selection of the determined channel CHi is passed to the data separator 4 (step 202). Accordingly, the data separator 4 extracts the MPEG audio data and the MPEG video data of the requested channel CHi to supply the extracted data to the audio/video decoder 5, while providing information data (such as a label message, or the like) about the requested channel to the controller 6 via the information data decoder 13 (step 203). Subsequently, the controller 6 starts the timer 6a to count an elapsed time after the channel switching (step 204), while checking whether or not the scanning time period (the time interval set for switching between the channels) Ts has ended (step 205). If the scanning time period has not ended yet, the operation goes back to step 203 and the steps thereafter, so that the channel CHi is maintained in a received state.

On the other hand, if the scanning time period Ts has ended in step 205, it is checked whether or not the scan-terminating condition is detected (step 206). If the scan-terminating condition is not detected, the controller 6 extracts from the broadcast signals information for specifying a changeover time of the broadcast contents of a next channel CHi+1 to be received. It is also checked whether the broadcast contents of the channel CHi+1 will change within the scanning time period Ts (=5 seconds) in the case of switching to the channel CHi+1 (step 207).

The information for specifying the changeover time of the broadcast contents may be, for example, a stop time of the broadcast contents being received currently, or a starting time of broadcast contents to be next received. The stop time of the broadcast contents being received currently is obtained by subtracting an elapsed time of one piece of music from a total time period of the music, as shown in FIG. 2. The starting time of the next broadcast contents is obtained by adding a time interval t between two pieces of music to the stop time described above. It is noted that the channel data may include the stop time of the broadcast contents being currently received, the starting time of the next broadcast contents, and the like.

If the broadcast contents do not change in step 207, the operation goes back to step 202 to receive the next channel CHi+1 and proceeds to the steps thereafter. On the other hand, if the broadcast contents change in step 207, a next channel CHi+2 to be received after the channel CHi+1 is determined (step 208), and thereafter the operation proceeds to step 207 again. That is, information for specifying the changeover time of the broadcast contents of the channel CHi+2 is extracted from the broadcast signal, and it is checked whether the broadcast contents of the channel CHi+2 will change within the scanning time period Ts (=5 seconds) in the case of switching to the channel CHi+2.

The described processes are performed repeatedly, and if the scan-terminating condition is detected in step 206, for example, the scan key is pressed to set the channel for viewing and/or listening, the controller 6 terminates the channel scanning operation.

According to one aspect of the present invention, after the channel switching, it is checked whether the broadcast contents of a channel being received currently will change within the scanning time period. If so, the time period for receiving the channel is prolonged. Thus, even though the broadcast contents change, the receiving time period, namely, the scanning time period of the channel, is extended, thereby allowing the user to identify the current broadcast contents with accuracy.

According to another aspect of the present invention, information which is transmitted together with the broadcast contents of a next channel to be received and which specifies a changeover time of the broadcast contents is extracted, and it is checked whether the broadcast contents of the next channel will change within the scanning time period, in the case of switching to the next channel, with reference to the extracted information. If the broadcast contents do not change, the next channel is to be received. In contrast, if the broadcast contents do change, the above operation is performed as to a further channel to be received. Accordingly, the broadcast contents never change within the scanning time period, thereby enabling the user to recognize the broadcast contents with certainty.

What is claimed is:

1. A channel scanning method for switching a receive channel at predetermined time intervals, comprising:

checking whether or not the broadcast contents of a receive channel being received currently, after the channel switching, will change within the predetermined time interval; and prolonging a time period for receiving said receive channel, in a case where said broadcast contents will change.

2. The channel scanning method according to claim 1, wherein information transmitted together with and associated with the broadcast contents is extracted, and said broadcast contents are determined to change when the contents of said extracted information change.

3. The channel scanning method according to claim 2, wherein an elapsed time of the receive channel after the channel switching is counted, and wherein, in a case where the broadcast contents of said receive channel change within the predetermined time interval, the elapsed time is reset and counting of the elapsed time is restarted, thereby prolonging the receiving time period.

4. The channel scanning method according to claim 2, wherein said broadcast contents include a piece of music, and said information associated with the broadcast contents pertains to one of a music name or title and an artist name.

5. The channel scanning method according to claim 1, wherein an elapsed time of the receive channel after the channel switching is counted, and wherein, in a case where the broadcast contents of said receive channel change within the predetermined time interval, the elapsed time is reset and counting of the elapsed time is restarted, thereby prolonging the receiving time period.

6. A multi-channel broadcast receiver that has a channel scanning function of switching a receive channel at predetermined time intervals, comprising:

means for receiving an instruction to perform a channel scan;

receive-channel switching means for performing a channel switching operation at the predetermined time intervals when the instruction to perform the channel scan is received;

time counting means for counting an elapsed time after the channel switching; and receiving-time-period control means for checking whether or not the broadcast contents of a receive channel being received currently, after the channel switching, will change within the predetermined time interval, and for prolonging a time period for receiving said receive channel, in a case where said broadcast contents will change.

7. The broadcast receiver according to claim 6, further comprising means for extracting information transmitted together with and associated with the broadcast contents, wherein said receiving-time-period control means determines that said broadcast contents will change when the contents of said information change.

8. The broadcast receiver according to claim 7, wherein said time counting means counts the elapsed time of the receive channel after the channel switching, and wherein, when the broadcast contents of said receive channel being received currently change within the predetermined time interval, said receiving-time-period control means resets the elapsed time and restarts counting of the elapsed time, thereby prolonging the receiving time period.

9. The broadcast receiver according to claim 7, wherein said broadcast contents include a piece of music, and said information associated with the broadcast contents is one of a music name or title and an artist name.

10. The broadcast receiver according to claim 6, wherein said time counting means counts the elapsed time of the receive channel after the channel switching, and wherein, when the broadcast contents of said receive channel being received currently change within the predetermined time interval, said receiving-time-period control means resets the elapsed time and restarts counting of the elapsed time, thereby prolonging the receiving time period.

11. A multi-channel broadcast receiver that has a channel scanning function of switching a receive channel at predetermined time intervals, comprising:

a broadcast receiving section for receiving a broadcast wave;

an instructing section for receiving an instruction to perform a channel scan;

a time counting section for counting an elapsed time after the channel switching; and a controller for controlling said broadcast receiving section by performing a channel switching operation at the predetermined time intervals when the instruction to perform the channel scan is received, for instructing said time counting section to count the elapsed time after the channel switching, for checking whether or not the broadcast contents of a receive channel being received currently, after the channel switching, will change within the predetermined time interval, and for prolonging a time period for receiving said receive channel in a case where said broadcast contents will change.

12. The broadcast receiver according to claim 11, wherein said broadcast receiving section receives a digital broadcast wave.

13. The broadcast receiver according to claim 12, wherein said controller extracts information associated with and transmitted together with the broadcast contents, and determines that said broadcast contents change when contents of said information change.

14. The broadcast receiver according to claim 13, wherein said broadcast contents include a piece of music, and said information associated with the broadcast contents is one of a music name or title and an artist name.

* * * * *